METHOD OF DEPOSITING A METAL OXIDE FILM BY ELECTRON BOMBARDMENT
Filed Sept. 11, 1969
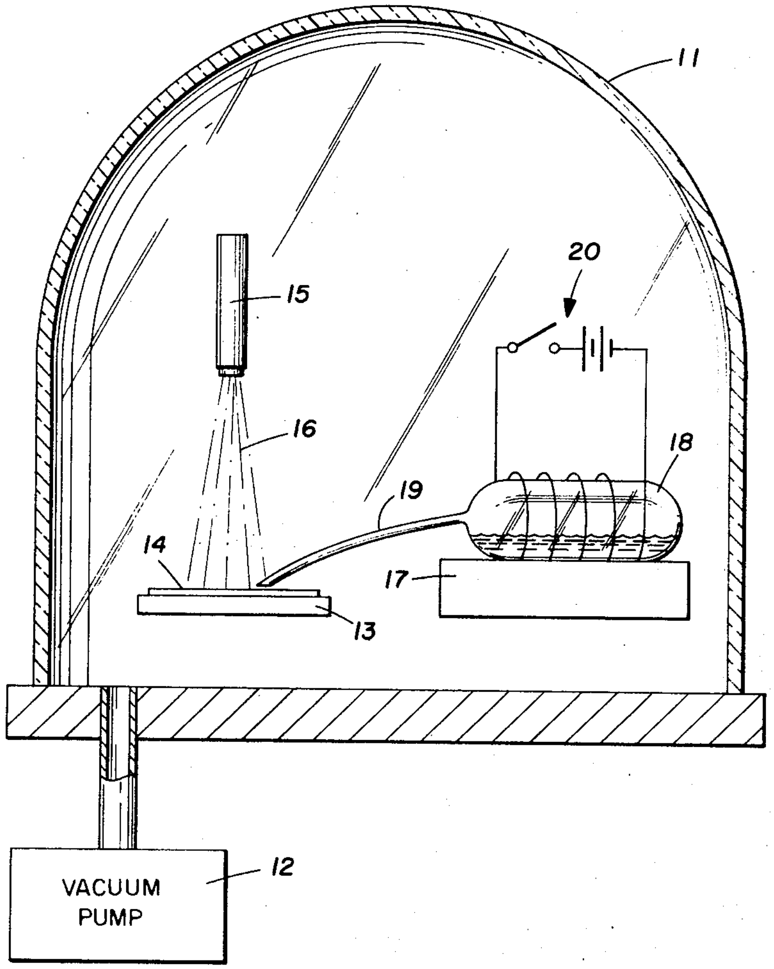
INVENTORS
WARREN O. KINSTLEY
DAVID R. SIVERTSEN United States Patent Office 3,704,216

Patented Nov. 28, 1972

3,704,216

METHOD OF DEPOSITING A METAL OXIDE FILM BY ELECTRON BOMBARDMENT

Warren O. Kinstley and David R. Sivertsen, Dallas, Tex., assignors to Texas Instruments Incorporated, Dallas, Tex.

Filed Sept. 11, 1969, Ser. No. 857,048
Int. Cl. C23f *7/02;* B01k *1/00*
U.S. Cl. 204—164 3 Claims

ABSTRACT OF THE DISCLOSURE

A substrate to be coated is supported within an evacuated chamber and subjected to a concentrated flow of an organo-metallic gas. Simultaneously, a high energy electron beam is directed to impinge upon the surface of the substrate to define the area of the substrate to be coated. The energy from the electron beam serves to both ionize the organo-metallic compound and to locally heat an area of the surface of the substrate to be coated thereby pyrolyzing the organo-metallic compound, driving off the organic material and depositing a coating of metal oxide upon the selected area of the substrate. MOS field effect transistors are formed with insulating oxide films produced by the present process.

This invention relates generally to the deposition of metal oxide coatings upon a substrate, and more particularly relates to deposition of metal oxides by the pyrolysis of an organo-metallic compound and the product produced thereby.

In the manufacture of electronic devices, it is very often necessary to form an insulative film upon the surface of a substrate. One of the techniques which has been used in the past is that of supporting a substrate within an atmosphere of an organo-metallic chemical and directing a beam of electrons against the substrate surface in order to supply energy to the vapor adjacent to the substrate surface. The molecules of the organo-metallic compound are polymerized and cross-linked to produce a thin insulating film upon the surface of the substrate. The resulting film, is of course, organic in nature and therefore may have certain undesirable electrical characteristics. Further, organic films may not be readily adaptable to the application of further chemical processing which are used in semiconductor device manufacture, such as etching and the deposition of other materials.

Inorganic metal oxides are used frequently and extensively in the processing of many different semiconductive devices. Such oxides are readily adaptable to the chemical processes necessary to form semiconductor devices and further, have very desirable electrical characteristics. These metal oxides have generally been formed by heating a substrate in the presence of an oxygen atmosphere or in the presence of water vapor. In semiconductor device manufacture, it is necessary that a semiconductive substrate only have a covering of oxide film in certain defined areas. Therefore, following the deposition of an entire surface layer of metal oxides by conventional techniques, it is necessary to remove selected areas of the oxide layer to define a desired pattern of discrete oxide coated areas upon the substrate surface. A technique whereby discrete oxide coated layers could be directly formed in a preselected pattern upon the substrate surface would eliminate one manufacturing process step and would be a desirable improvement over the present method of forming discrete oxide coated areas.

This invention is concerned with a method of forming discrete metal oxide coated areas upon a substrate. The invention involves the use of a focused energy source, such as a source of electrons, which may be directed to impinge in a preselected pattern upon the surface area of the substrate to be coated. Energy from the focused source pyrolyzes the organo-metallic gas which is directed upon the substrate surface, thereby driving off the organic material and leaving a coating of metal oxide upon the substrate surface areas within the preselected pattern. The film is used in the manufacture of MOS field effect transistors.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawing, wherein:

The figure is a schematic representation of an apparatus which may be used to practice the method of deposition in accordance with the invention.

Referring to the figure, there is shown an evacuated chamber 11 together with a diffusion type vacuum pump 12. Although the method of the invention may be practiced in different atmospheric conditions and pressures, certain embodiments of the process are preferably performed at reduced pressures. The pump 12 provides low pressures under which one embodiment of the method of deposition is most advantageously performed. A work holder 13 is arranged within the evacuated chamber 11 to support a substrate 14 upon which a metal oxide coating is to be applied. For example, the substrate 14 may be of silicon material as used in the manufacture of MOS field effect transistors. An electron gun 15 is mounted above and in alignment with the substrate 14 to direct a stream of electrons 16 to impinge upon the surface of the substrate 14 in a preselected pattern. Mounted adjacent to the support 13 is a bracket 17 which supports an ampoule 18 containing a quantity of an organo-metallic chemical compound, preferably in a liquid state at room temperature conditions. The ampoule 18 has a long slender nozzle 19 which is positioned to direct flow of vapors of the organo-metallic material from the liquid reservoir within the ampoule 18 onto a selected area of the surface of the substrate 14. Facilities are provided, such as a coil and battery arrangement 20, to heat the liquid within the ampoule 18 when necessary to insure that an adequate supply of vapors are delivered through the nozzle 19 onto the surface of the substrate 14. Whether heating or cooling is required depends upon the characteristic of the particular organo-metallic compound to be used in the deposition process. Those compounds which are most advantageously used in the process are ones that are liquid at room temperature but which may boil at the reduced pressures at which the process is performed.

The electron gun 15 is of a conventional type in which both the direction and intensity of the stream of electrons delivered from the gun may be controlled. That is, the energy with which the electrons are directed from the gun 15 onto the substrate 14 may be varied and the area of the substrate 14 upon which the electron beam is directed may be preselected and programmed as desired. The beam of electrons 16 may be deflected from side to side and from top to bottom across the substrate surface so as to scan the entire area of the substrate. By selectively blanking the beam of electrons while scanning the surface in a repetitive pattern, such as is done with the electron gun in a cathode ray tube used in a television receiver, certain discrete and preselected areas upon the surface of the substrate 14 may be defined as the only surface areas which are bombarded by electrons. This regulated bombardment selectively heats only those areas which are subjected to the streams of electrons so as to define a preselected pattern of heated areas across the surface of the substrate. However, the deflection of the electron beam and pattern definition is not critical to the present invention and for purposes of illustration, it may be assumed that only a small area of the substrate 14 is to be coated with a metal oxide. For this purpose a single, generally circular spot on the surface of the substrate 14 of from eight to ten mils in diameter is continuously bombarded by the beam of electrons 16. Conventional etching steps may also be employed in combination with the present method of forming a dielectric film on selected areas. That is, a continuous film may be formed on the substrate and then selectively etched or the film may be initially deposited only on selected areas and then an etch process used to more precisely configure the geometry of the film.

In practicing the process, the substrate 14 is first placed upon the work holder 13 within the evacuated chamber 11. The ampoule 18 is then filled with a selected organo-metallic compound and the nozzle 19 is positioned to direct vapors from the ampoule 18 onto a selected area of the substrate 14. The organo-metallic compound may also be a mixture of a number of different compounds whose relative proportions are chosen to result in a desired film composition. If necessary the heating system 20 is actuated to heat the liquid within the ampoule 18 and produce gas vapors. The evacuated chamber 11 is sealed and the vacuum pump 12 is actuated to reduce the pressure within the evacuated chamber 11, a pressure on the order of $10^{-5}$ torr. Next, the electron gun 15 is energized to direct a stream of electrons 16 onto the selected area of the substrate being subjected to the flow of organo-metallic vapors. The energy from the beam of electrons 16 ionizes some of the vapor molecules and heat from the selected substrate area being bombarded pyrolyzes the gas molecules adjacent the area breaking them down into an organic constituent and a metal oxide constituent. The metal oxide is deposited upon the selected substrate area as a coating while the vacuum system 12 removes the organic particles from the evacuated chamber 11. The present method employing electron beam bombardment succeeds in preventing the cross-linking of the organo-metallic molecules to form an organic film upon the substrate area. In other embodiments of the present method, the heat for pyrolyzation could be supplied by a different focused energy source such as a laser.

In practicing the present deposition process, it may be necessary to supply heat to the substrate being coated to control the thermal gradients within the substrate and more precisely define the geometry of the deposited oxide film.

By way of example, one of the materials which has been used successfully to form a metal oxide layer upon the surface of a silicon substrate in accordance with the present invention is that of tetraethylorthosilicate (TEOS). TEOS has the characteristic that it has a relatively low temperature of reaction in comparison with the temperature for thermal oxidation of silicon (approximately 400° C. vs. 1000° C.). TEOS also has the desirable property that it is a liquid at room temperature while boiling at approximately $10^{-5}$ torr, eliminating the need to apply heat to the ampoule 18 in order to generate organo-metallic vapors. Applying a beam of electrons to the substrate 14 while simultaneously impinging TEOS vapors from the ampoule 18 upon the selected surface area of the substrate 14 being subjected to electron bombardment, succeeds in accomplishing two results. First, some of the molecules of TEOS vapors are ionized and second, and most importantly, the heat from the beam of electrons succeeds in pyrolyzing the TEOS molecules, breaking them down into organic constituents and some oxide ($SiO_x$) of silicon. The oxide is, of course, directly deposited upon the surface of the substrate 14. This electron beam bombardment succeeds in separating the organic constituents from the TEOS and thereby prevents the cross-linking of molecules which would otherwise form an organic film upon the surface. The organic constituents of the TEOS which are separated from the metal oxide are withdrawn from the evacuated chamber 11 by the vacuum system 12.

During the deposition of the TEOS upon the substrate surface, it has been found desirable to use a relatively high intensity electron beam having an energy level on the order of 75 kev., an electron current on the order of $.09 \times 10^{-3}$ amperes, and a beam size in the range of from eight to ten mils in diameter. It has also been found desirable to vary the thickness of the oxide layer deposited by holding the electron beam parameters constant and controlling the time of exposure of the substrate to the electron beam. For example, different electron beam exposure times using TEOS vapors under the above given electron beam parameters resulted in different thicknesses of siliconeous metal oxide layers as shown in Table A. The visible color of a thin film is, of course, a general indication of the thickness of the film.

TABLE A

| | Film color | Approx. film thickness, A. |
|---|---|---|
| Beam exposure time, seconds: | | |
| 30 | None | 0 |
| 60 | Gray | 100 |
| 90 | Gray-yellow | 200 |
| 125 | Tan | 300 |
| 190 | Violet | 1,000 |
| 210 | Green-blue | 1,500–1,850 |
| 255 | Blue-red | 1,500–2,500 |
| 340 | Yellow | 2,100 |
| 360 | Red-yellow | 2,100–2,500 |

The metal oxide films deposited with TEOS were found to be relatively uniform in thickness across the entire area of deposition even through the field density of an electron beam follows a gaussian distribution pattern. The oxide layer was also found to have good electrical insulation properties.

By way of a second example, another organo-metallic compound which was found to be readily depositable upon a silicon substrate by the present electron bombardment technique was tetraisopropylorthotitanate (TIPOT). TIPOT is placed in the ampoule 18 and a vapor of the substance is directed upon a selected area of the surface of the substrate 14. An electron current in the range of 50 microamperes is directed upon the surface area of the substrate being subjected to TIPOT vapors. Heating from the electron beam pyrolyzes the TIPOT forming a polycrystalline titanium dioxide film upon the selected surface area of the substrate 14. The $TiO_2$ film deposited by the present method has been found to have very desirable electrical characteristics and because of its high dielectric constant is useful in forming the insulative layer in the manufacture of MOS field effect transistors.

The present method enables the deposition of an oxide material having desirable properties, such as a relatively high dielectric constant and radiation stability as in $TiO_2$. By mixing various quantities of organo-metallic materials, films having different thickness and dielectric constants can be formed with the present method. For example, various quantities of TEOS and TIPOT can be mixed to form a film containing desired amounts of both $SiO_2$ and $TiO_2$ to have a selected dielectric constant.

The present method can be used to form an insulating oxide film upon selected areas of a silicon substrate. The oxide covered areas of the substrate are then coated with metal electrodes. The devices are separated and the silicon substrates are connected to electrodes in the conventional manner to form metal-oxide-semiconductor field effect transistors. The characteristics of the MOS devices formed can be varied by changing the dielectric constants of the insulating oxide layers, as pointed out above, to vary the breakdown voltages and charge carrier concentrations of the devices.

Many other organo-metallic materials may be used to deposit metal oxide film upon substrates in accordance with the method of the present invention. Also, various mixtures of different materials can be employed. For example, a mixture of 10% trimethylborate and 90% tetraethylorthosilicate (TEOS) has been used to deposit an oxide film rich in boron upon a substrate. The boron-doped $SiO_2$ film would have potential application as a reservoir for P type dopant if a diffusion step would be desired in the processing of particular devices.

It may be seen that although the invention has been described in terms of pyrolysis of one organo-metallic material to deposit a metal oxide on a substrate, another embodiment of the invention might employ the pyrolization of a mixture containing constituents of both organic and inorganic components. In this example, the organic constituent would be separated and the inorganic material deposited on the substrate.

Although the embodiments of the invention described, only cite two examples of different organo-metallic materials that may be selectively pyrolyzed by an electron beam, it should be apparent to one skilled in the art that there are many different organo-metallic compounds which might be used (to deposit metal oxide films upon the surface of the substrate) in accordance with the teaching of the invention.

Although a preferred embodiment of the invention has been described in detail, it is to be understod that various changes, substitutions and alterations can be made therein without departing from the spirit and scope of the invention as defined by the appended claims.

What is claimed is:

1. A method of producing a metal oxide film upon a selected area of a substrate comprising:

supporting a substrate on which a layer of metal oxide film is to be formed within a chamber:

directing a flow of vaporous organo-metallic material comprising tetraisopropylorthotitanate against the surface of the substrate upon the area where the metal-oxide film is to be formed; and impinging a beam of electrons upon the substrate to define a selected area upon which the metal-oxide film is to be formed by heating the area to pyrolyze the organo-metallic material adjacent the selected area, the molecules of said organo-metallic material being separated into organic constituents and a metal oxide material, said metal oxide being deposited upon the area of the substrate defined by the electron beams.

2. A method as defined by claim 1 wherein the substrate is silicon.

3. A method as defined by claim 1 wherein the substrate is separately heated during deposition to prevent thermal gradients from developing therein.

References Cited

UNITED STATES PATENTS

| | | | |
|---|---|---|---|
| 3,293,085 | 12/1966 | Smith et al. | 204—164 UX |
| 3,394,066 | 7/1968 | Miles | 204—164 |
| 3,419,487 | 12/1968 | Robbins et al. | 204—164 |
| 3,473,959 | 10/1969 | Ehinger et al. | 204—164 X |
| 3,536,547 | 10/1970 | Schmidt | 204—164 X |

FREDERICK C. EDMUNDSON, Primary Examiner

U.S. Cl. X.R.

204—523. 328